(12) United States Patent
Kim et al.

(10) Patent No.: US 9,570,303 B2
(45) Date of Patent: Feb. 14, 2017

(54) CONFORMAL AMORPHOUS CARBON FOR SPACER AND SPACER PROTECTION APPLICATIONS

(71) Applicant: Applied Materials, Inc., Santa Clara, CA (US)

(72) Inventors: Sungjin Kim, Palo Alto, CA (US); Deenesh Padhi, Sunnyvale, CA (US); Sung Hyun Hong, Fremont, CA (US); Bok Hoen Kim, San Jose, CA (US); Derek R. Witty, Fremont, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 0 days.

(21) Appl. No.: 14/736,848

(22) Filed: Jun. 11, 2015

(65) Prior Publication Data

US 2015/0279676 A1    Oct. 1, 2015

Related U.S. Application Data

(63) Continuation of application No. 14/371,989, filed as application No. PCT/US2013/021769 on Jan. 16, (Continued)

(51) Int. Cl.
*H01L 21/302* (2006.01)
*H01L 21/461* (2006.01)
(Continued)

(52) U.S. Cl.
CPC ..... *H01L 21/0337* (2013.01); *H01L 21/02115* (2013.01); *H01L 21/02274* (2013.01); (Continued)

(58) Field of Classification Search
None
See application file for complete search history.

(56) References Cited

U.S. PATENT DOCUMENTS 4,882,256 A * 11/1989 Osawa ............... G03G 5/0436
                                                              430/132
6,500,756 B1    12/2002 Bell et al.
(Continued)

FOREIGN PATENT DOCUMENTS

KR    10-2009-0018725    2/2009

OTHER PUBLICATIONS

International Search Report and Written Opinion dated May 15, 2013 for International Application No. PCT/US2013/021769.
(Continued)

*Primary Examiner* — Stephanie Duclair
(74) *Attorney, Agent, or Firm* — Patterson & Sheridan, LLP

(57) ABSTRACT

A method of forming a nitrogen-doped amorphous carbon layer on a substrate in a processing chamber is provided. The method generally includes depositing a predetermined thickness of a sacrificial dielectric layer over a substrate, forming patterned features on the substrate by removing portions of the sacrificial dielectric layer to expose an upper surface of the substrate, depositing conformally a predetermined thickness of a nitrogen-doped amorphous carbon layer on the patterned features and the exposed upper surface of the substrate, selectively removing the nitrogen-doped amorphous carbon layer from an upper surface of the patterned features and the upper surface of the substrate using an anisotropic etching process to provide the patterned features filled within sidewall spacers formed from the nitrogen-doped amorphous carbon layer, and removing the patterned features from the substrate.

17 Claims, 6 Drawing Sheets

Related U.S. Application Data 2013, now abandoned, which is a continuation of application No. 13/354,129, filed on Jan. 19, 2012, now abandoned.

(51) Int. Cl.
  C03C 15/00 (2006.01)
  C03C 25/68 (2006.01)
  C23F 1/00 (2006.01)
  B44C 1/22 (2006.01)
  H01L 21/033 (2006.01)
  H01L 21/3213 (2006.01)
  H01L 21/311 (2006.01)
  H01L 21/02 (2006.01)

(52) U.S. Cl.
  CPC .... H01L 21/0338 (2013.01); H01L 21/31111 (2013.01); H01L 21/31116 (2013.01); H01L 21/31144 (2013.01); H01L 21/32136 (2013.01); H01L 21/32137 (2013.01); H01L 21/32139 (2013.01)

(56) References Cited

U.S. PATENT DOCUMENTS

| | | |
|---|---|---|
| 6,596,599 B1 | 7/2003 | Guo |
| 7,935,464 B2 | 5/2011 | Ngai |
| 2007/0049040 A1* | 3/2007 | Bai .............. H01L 21/0337 438/712 |
| 2008/0311753 A1 | 12/2008 | Zheng et al. |
| 2009/0061638 A1* | 3/2009 | Yi ................ H01L 21/32139 438/717 |
| 2009/0311634 A1 | 12/2009 | Yue et al. |
| 2010/0075503 A1 | 3/2010 | Bencher et al. |
| 2010/0093187 A1* | 4/2010 | Lee .................. C23C 16/26 438/780 |
| 2010/0136784 A1 | 6/2010 | Mebarki et al. |
| 2010/0136792 A1 | 6/2010 | Mebarki et al. |
| 2010/0291713 A1 | 11/2010 | Lee et al. |
| 2011/0021026 A1* | 1/2011 | Luning ............ H01L 21/3086 438/692 |
| 2011/0244142 A1 | 10/2011 | Cheng et al. |

OTHER PUBLICATIONS

Office Action for U.S. Appl. No. 13/354,129 dated Jun. 7, 2013.
Final Office Action for U.S. Appl. No. 13/354,129 dated Dec. 31, 2013.
International Preliminary Report on Patentability for International Application No. PCT/US13/021769 dated Jul. 31, 2014.
Office Action for U.S. Appl. No. 14/371,989 dated Dec. 3, 2014.
Final Office Action for U.S. Appl. No. 14/371,989 dated Feb. 25, 2015.
Search Report and Office Action for Taiwan Application No. 102102025 dated Apr. 13, 2016.

* cited by examiner

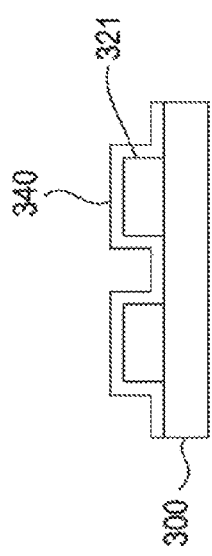
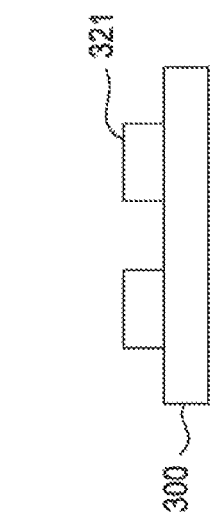
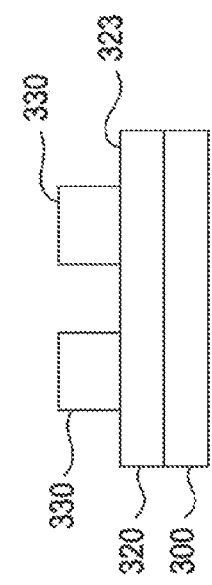
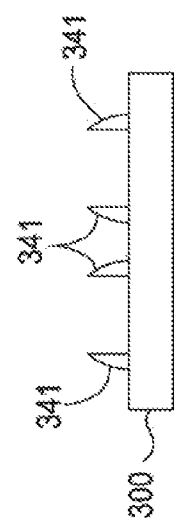
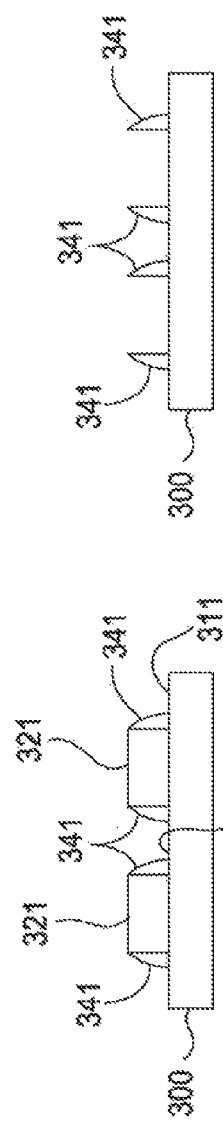

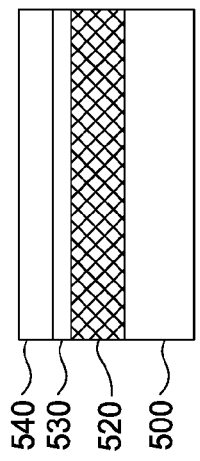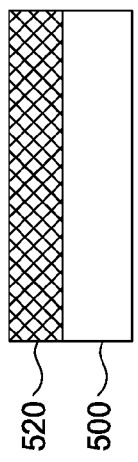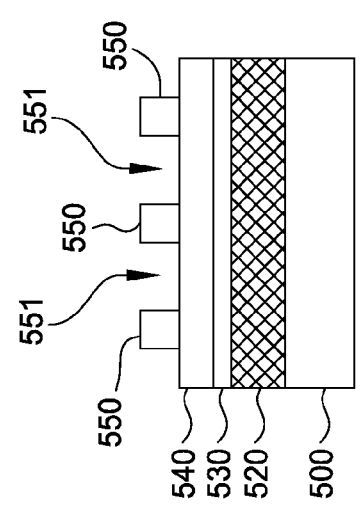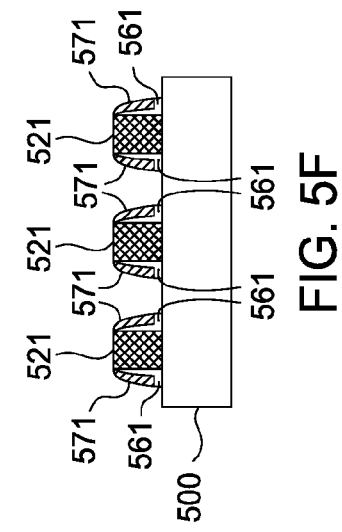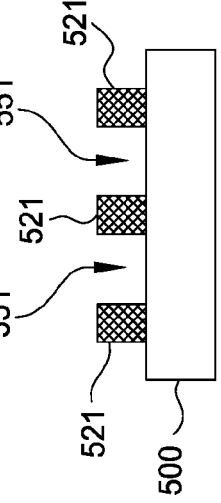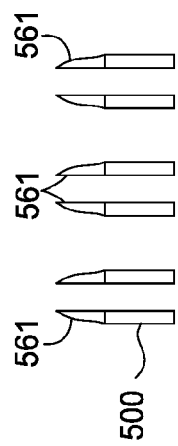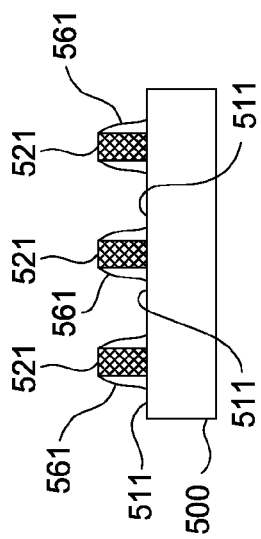

CONFORMAL AMORPHOUS CARBON FOR SPACER AND SPACER PROTECTION APPLICATIONS

CROSS-REFERENCE TO RELATED APPLICATIONS

This application is a continuation application of co-pending U.S. patent application Ser. No. 14/371,989, filed on Jan. 16, 2013, which is a continuation application of U.S. patent application Ser. No. 13/354,129, filed on Jan. 19, 2012 (now abandoned), all of which are incorporated by reference in their entirety herein.

BACKGROUND OF THE INVENTION

Field of the Invention

Embodiments of the present invention generally relate to the fabrication of integrated circuits and particularly to a method for protecting sidewalls of hard mask spacers during an etching process.

Description of the Related Art

Reducing the size of integrated circuits (ICs) results in improved performance, increased capacity and/or reduced cost. Each size reduction requires more sophisticated techniques to form the ICs. Photolithography is commonly used to pattern ICs on a substrate. An exemplary feature of an IC is a line of a material which may be a metal, semiconductor or insulator. Linewidth is the width of the line and the spacing is the distance between adjacent lines. Pitch is defined as the distance between a same point on two neighboring lines. The pitch is equal to the sum of the linewidth and the spacing. Due to factors such as optics and light or radiation wavelength, however, photolithography techniques have a minimum pitch below which a particular photolithographic technique may not reliably form features. Thus, the minimum pitch of a photolithographic technique can limit feature size reduction.

Self-aligned double patterning (SADP) is one method for extending the capabilities of photolithographic techniques beyond the minimum pitch. Such a method is illustrated in FIGS. 1A-1F. With reference to FIG. 1A, patterned core features 102 are formed from sacrificial structural material above a dielectric layer 114 on a substrate 100 using standard photo-lithography and etching techniques. The patterned features are often referred to as placeholders or cores and have linewidths and/or spacings near the optical resolution of a photolithography system using a high-resolution photomask. As shown in FIG. 1B, a conformal layer 106 of hard mask material such as silicon oxide is subsequently deposited over core features 102. Hard mask spacers 108 are then formed on the sides of core features 102 by preferentially etching the hard mask material from the horizontal surfaces with an anisotropic plasma etch to open the hard mask material deposited on top of the patterned core features 102 as well as remove the hard mask material deposited at the bottom between the two sidewalls, as shown in FIG. 1C. The patterned core features 102 may then be removed, leaving behind hard mask spacers 108 (FIG. 1D). At this point hard mask spacers 108 may be used as an etch mask for transferring the pattern to the dielectric layer 114 to form dielectric ribs 116, as shown in FIG. 1E. The hard mask spacers 108 are subsequently removed (FIG. 1F). Therefore, the density of the dielectric ribs 116 is twice that of the photo-lithographically patterned core features 102, and the pitch of the dielectric ribs 116 is half the pitch of the patterned core features 102.

Currently, hard mask spacers 108 are formed by an atomic layer deposition (ALD) using an etchable material such as silicon oxides. These oxides are typically deposited at very low temperature (e.g., less than 200° C.). As a result, the material quality is poor, with low density and poor mechanical strength and degraded chemical resistance to subsequent etching chemistries. During the etching of the hard mask material, the spacer sidewalls, e.g., sidewalls 107 (FIG. 1D) are exposed to the plasma. Due to the poor material quality of typical ALD hard mask spacers, the sidewalls are damaged and thus causing higher line edge roughness. This issue becomes serious with shrinking feature size.

Therefore, there is a need for a method of protecting the sidewalls of the hard mask spacers such that the patterning integrity is greatly improved.

SUMMARY OF THE INVENTION

Embodiments of the present invention provide a method for protecting sidewalls of hard mask spacers during an etching process. In one embodiment, a method of forming a nitrogen-doped amorphous carbon layer on a substrate in a processing chamber is provided. The method generally includes depositing a predetermined thickness of a sacrificial dielectric layer over a substrate, forming patterned features on the substrate by removing portions of the sacrificial dielectric layer to expose an upper surface of the substrate, depositing conformally a predetermined thickness of a nitrogen-doped amorphous carbon layer on the patterned features and the exposed upper surface of the substrate, selectively removing the nitrogen-doped amorphous carbon layer from an upper surface of the patterned features and the upper surface of the substrate using an anisotropic etching process to provide the patterned features filled within sidewall spacers formed from the nitrogen-doped amorphous carbon layer, and removing the patterned features from the substrate.

In another embodiment, a method of forming a device in a processing chamber is provided. The method generally includes forming patterned features on an upper surface of a substrate, depositing conformally a predetermined thickness of a sacrificial dielectric layer on the patterned features and an exposed upper surface of the substrate, selectively removing the sacrificial dielectric layer from an upper surface of the patterned features and the exposed upper surface of the substrate to provide the patterned features filled within first sidewall spacers formed from the sacrificial dielectric layer, forming second sidewall spacers adjacent to the first sidewall spacers, the second sidewall spacers being formed from a nitrogen-doped amorphous carbon material having a carbon:nitrogen ratio of between about 0.1% nitrogen to about 4.0% nitrogen, and removing the patterned features filled within the first sidewall spacers.

In yet another embodiment, a method of forming a nitrogen-doped amorphous carbon layer on a substrate in a processing chamber is provided. The method generally includes depositing conformally a nitrogen-doped amorphous carbon layer on patterned features formed on the substrate, wherein the deposition is performed by introducing a nitrogen-containing hydrocarbon source and a plasma-initiating gas into the processing chamber, and the nitrogen-containing hydrocarbon source comprises benzonitrile, selectively removing the nitrogen-doped amorphous carbon layer from an upper surface of the patterned features and an upper surface of the substrate using an anisotropic etching process to provide patterned features filled within sidewall spacers formed from the nitrogen-doped amorphous carbon layer, and removing the patterned features from the substrate.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

FIGS. 3A-3E illustrate cross-sectional views of a structure formed by the steps set forth in FIG. 2.

FIGS. 5A-5H illustrate cross-sectional views of a structure formed by the steps set forth in FIG. 4.

DETAILED DESCRIPTION

Embodiments of the present invention relate to an ultra-conformal strippable spacer process. In various embodiments, an ultra-conformal carbon-based material, such as amorphous carbon, is deposited over features of sacrificial structure material patterned using a high-resolution photomask. The ultra-conformal carbon-based material serves as a protective layer during an ashing or etching process, leaving the sacrificial structure material with an upper surface exposed and sidewalls protected by the carbon-based spacers. Upon removal of the sacrificial structure material, the remaining carbon-based spacers may perform as a hardmask layer for etching the underlying layer or structure. In one example, the carbon-based material may be an undoped or a nitrogen-doped amorphous carbon material.

Embodiments of the present invention may be performed using any suitable processing chamber such as a plasma enhanced chemical vapor deposition (PECVD) chamber. The processing chamber may be incorporated into a substrate processing system. An exemplary substrate processing system that may be used to practice the invention is described in commonly assigned U.S. Pat. No. 6,364,954 issued on Apr. 2, 2002, to Salvador et. al. and is herein incorporated by reference. Examples of suitable systems include the CENTURA® systems which may use a DxZ™ processing chamber, PRECISION 5000® systems, PRODUCER™ systems, PRODUCER GT™ and the PRODUCER SE™ processing chambers which are commercially available from Applied Materials, Inc., Santa Clara, Calif. It is contemplated that other processing system, including those available from other manufacturers, may be adapted to practice the embodiments described herein.

Exemplary Fabrication Sequence Employing a-C Protective Layer

Figure 1A:
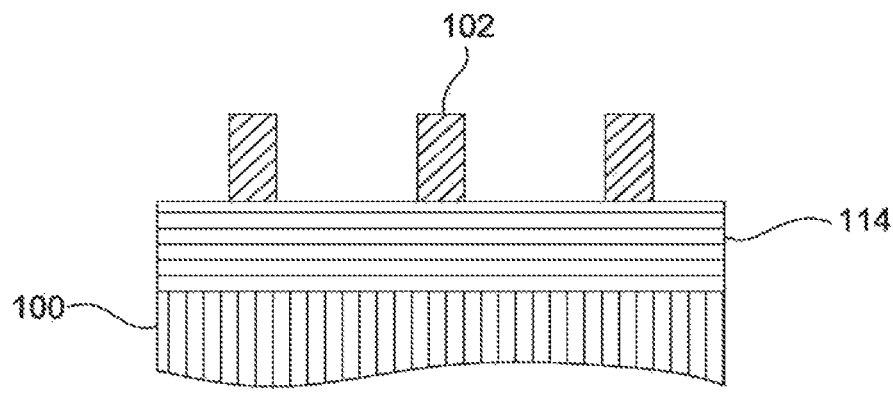
FIGS. 1A-1F illustrate cross-sectional views representing a conventional double patterning process.
Figure 1B:
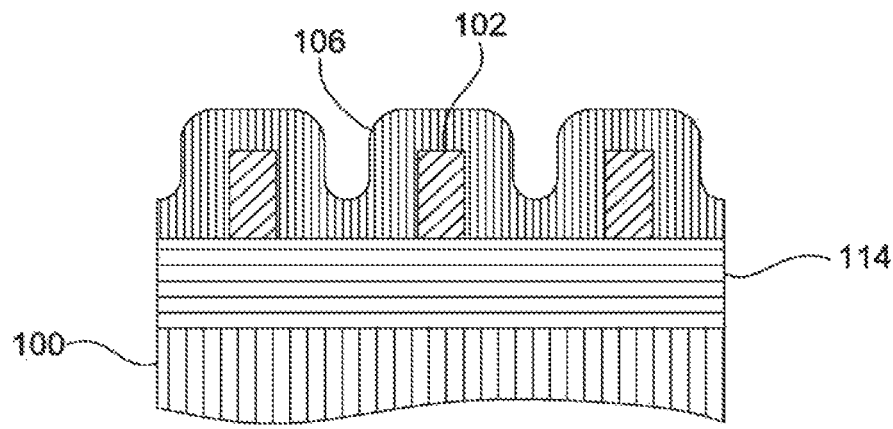
Figure 1C:
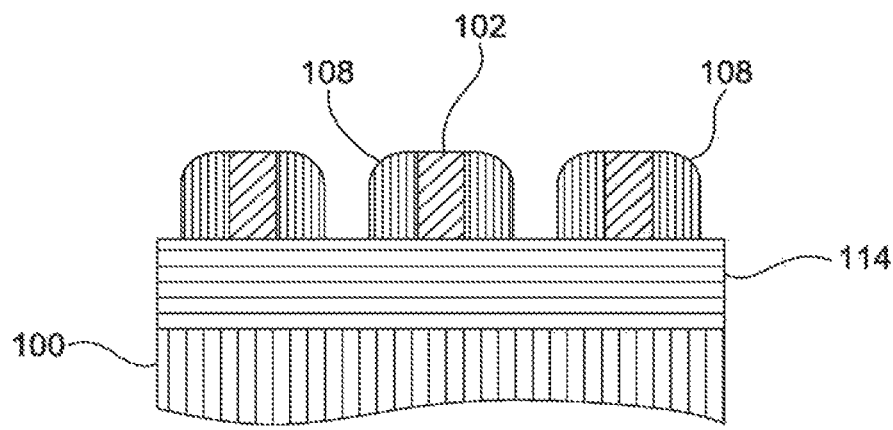
Figure 1D:
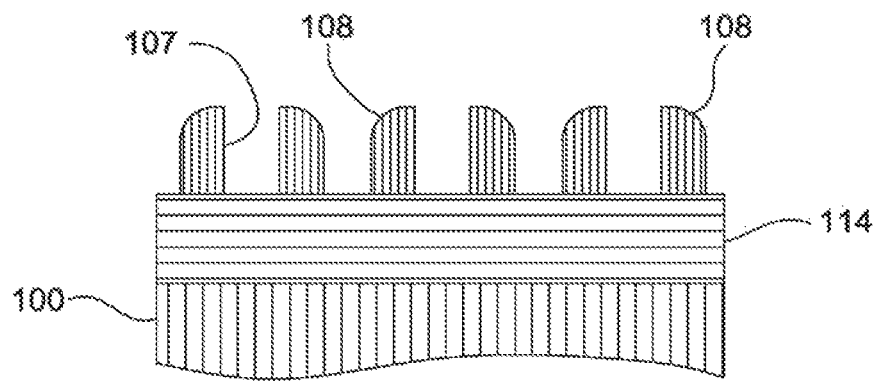
Figure 1E:
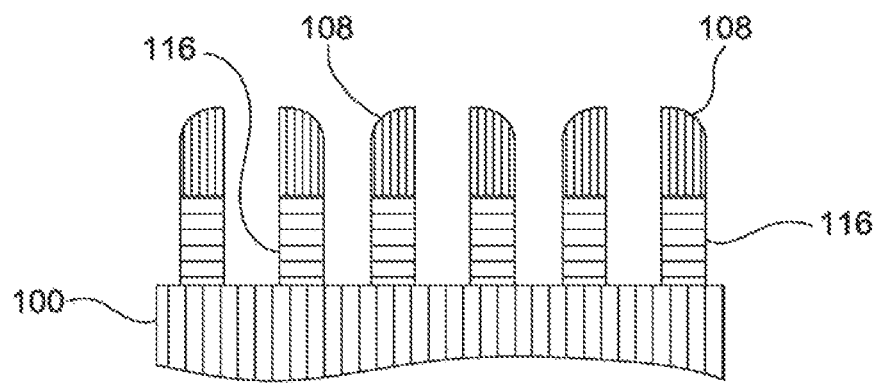
Figure 1F:
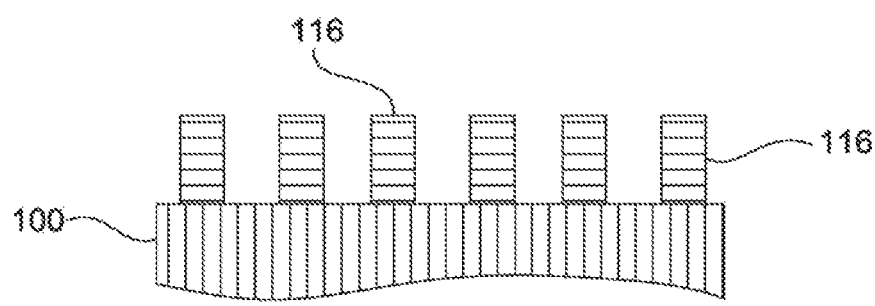
Figure 2:
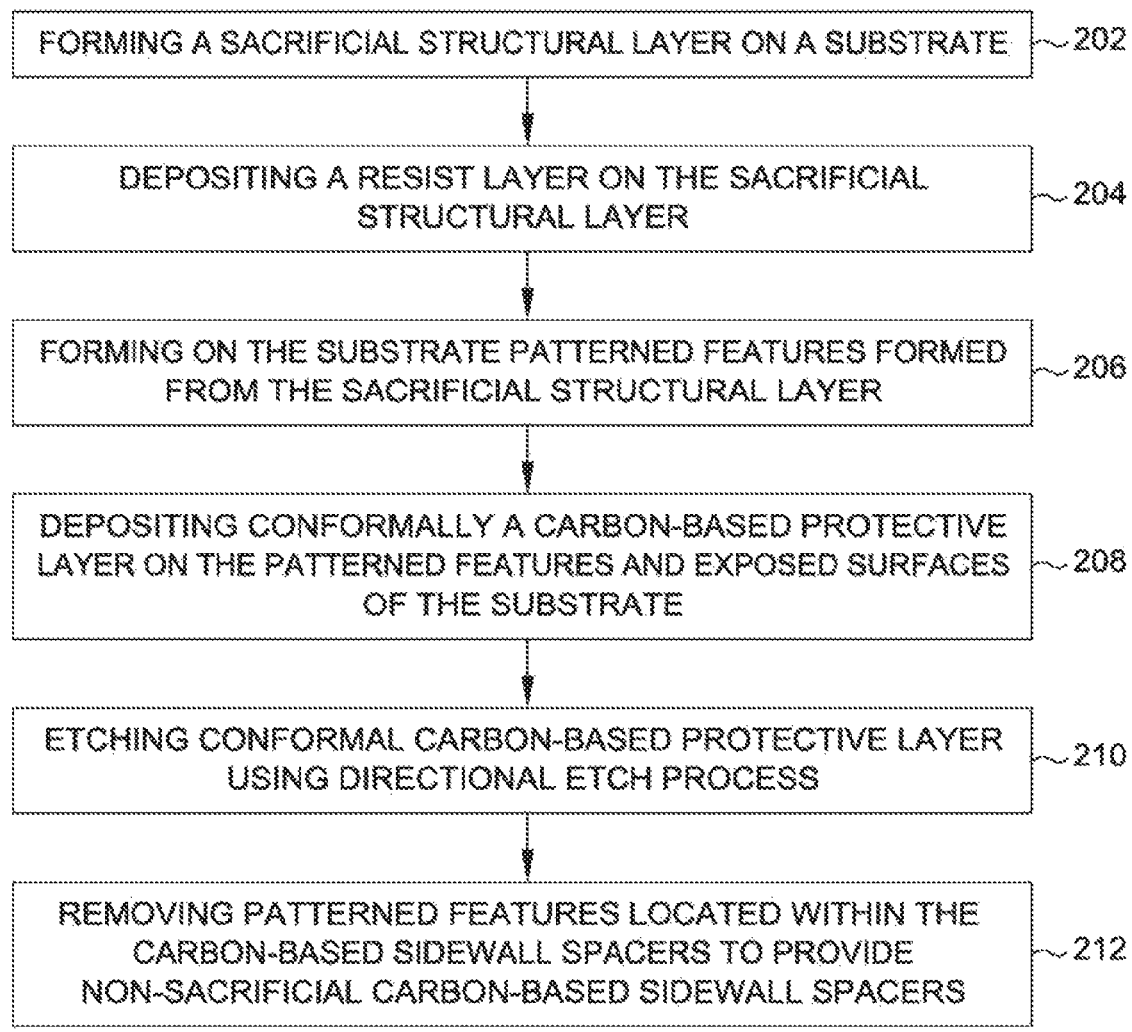
FIG. 2 is a flowchart depicting steps associated with an exemplary patterning process according to one embodiment of the invention.

FIG. 2 is a process flowchart depicting steps associated with an exemplary self-aligned double patterning process according to one embodiment of the invention. FIGS. 3A-3E illustrate cross-sectional views of a structure formed by the steps set forth in FIG. 2. It is contemplated that the self-aligned double patterning process is chosen for illustration purpose. The concept of the invention is equally applicable to other processes, single or dual patterning scheme, such as via/hole shrink process, self-aligned triple patterning (SATP) process, or self-aligned quadruple patterning (SAQP) process, etc. that may require the use of protective spacers with variable line width and spacing or protective sacrificial layer as needed in various semiconductor processes such as NAND flash application, DRAM application, or CMOS application, etc. In addition, the number or sequence of steps illustrated in FIG. 2 is not intended to limiting as to the scope of the invention described herein, since one or more steps can be added, deleted and/or reordered without deviating from the basic scope of the invention described herein.

The process 200 starts at box 202 by forming a sacrificial structural layer 320 on a substrate 300. The sacrificial structural layer 320 may be a silicon-based material such as silicon oxide, silicon nitride, or polysilicon. Alternatively, the sacrificial structural layer 320 may be a carbon-based material such as amorphous carbons. In cases where a carbon-based sacrificial structural layer is desired, the sacrificial structural layer 320 may be a combination of amorphous carbon and hydrogen (hydrogenated amorphous carbon film). One exemplary amorphous carbon film may be a strippable Advanced Patterning Film™ (APF) material commercially available from Applied Materials, Inc. of Santa Clara, Calif. It is contemplated that the choice of materials used for the sacrificial structural layer 320 may vary depending upon the etching/ashing rate relative to the conformal protective layer to be formed thereon. While not shown, in certain embodiments where a carbon-based sacrificial structural layer is used, one or more anti-reflective coating layers may be deposited on the carbon-based sacrificial structural layer to control the reflection of light during a lithographic patterning process. Suitable anti-reflective coating layer may include silicon dioxide, silicon oxynitride, silicon nitride, or combinations thereof. One exemplary anti-reflective coating layer may be a DARC™ material commercially available from Applied Materials, Inc. of Santa Clara, Calif.

The substrate 300 may have a substantially planar surface 323 as shown. Alternatively, the substrate 300 may have patterned structures, a surface having trenches, holes, or vias formed therein. While the substrate 300 is illustrated as a single body, the substrate 300 may contain one or more materials used in forming semiconductor devices such as metal contacts, trench isolations, gates, bitlines, or any other interconnect features. In one embodiment, the substrate 300 may include one or more metal layers, one or more dielectric materials, semiconductor material, and combinations thereof utilized to fabricate semiconductor devices. For example, the substrate 300 may include an oxide material, a nitride material, a polysilicon material, or the like, depending upon application. In cases where a memory application is desired, the substrate 300 may include the silicon substrate material, an oxide material, and a nitride material, with or without polysilicon sandwiched in between.

In some embodiments, the substrate 300 may include a plurality of alternating oxide and nitride materials (i.e., oxide-nitride-oxide (ONO)), one or more oxide or nitride materials, polysilicon or amorphous silicon materials, oxides alternating with amorphous silicon, oxides alternating with polysilicon, undoped silicon alternating with doped silicon, undoped polysilicon alternating with doped polysilicon, or updoped amorphous silicon alternating with doped amorphous silicon deposited on a surface of the substrate (not shown). The substrate 300 may be a material or a layer stack comprising one or more of the following: crystalline silicon, silicon oxide, silicon oxynitride, silicon nitride, strained silicon, silicon germanium, tungsten, titanium nitride, doped or undoped polysilicon, doped or undoped silicon wafers and patterned or non-patterned wafers, silicon on insulator (SOI), carbon doped silicon oxides, silicon nitrides, doped silicon, germanium, gallium arsenide, glass, sapphire, low k dielectrics, and combinations thereof.

At box 204, a resist layer 330, such as a photoresist material, is deposited on the sacrificial structural layer 320 as shown in FIG. 3A.

At box 206, patterned features 321 formed from the sacrificial structural layer 320 are produced on the substrate 300 using standard photo-lithography and etching techniques, as shown in FIG. 3B. The patterned features may be formed from any suitable material, for example oxides, such as silicon dioxide, silicon oxynitride, or nitrides such as silicon nitride. The patterned features are sometimes referred to as placeholders, mandrels or cores and have specific linewidths and/or spacings based upon the photoresist material used. The width of the patterned features 321 may be adjusted by subjecting the resist layer 330 to a trimming process. After the pattern has been transferred into the sacrificial structural layer 320, any residual photoresist and hard mask material (if used) are removed using a suitable photoresist stripping process.

At box 208, a carbon-based protective layer 340 is deposited conformally or substantially conformally on the patterned features 321 and the exposed surfaces of the substrate 300, as shown in FIG. 3C. The thickness of the carbon-based protective layer 340 may be between about 5 Å and about 200 Å. In one embodiment, the carbon-based protective layer is an amorphous carbon (a-C) layer. The amorphous carbon may be undoped or doped with nitrogen. In one example, the carbon-based protective layer 340 is a nitrogen-doped amorphous carbon layer. The nitrogen-doped amorphous carbon layer may be deposited by any suitable deposition techniques such as plasma enhanced chemical vapor deposition (PECVD) process. In one embodiment, the nitrogen-doped amorphous carbon layer may be deposited by flowing, among others, a hydrocarbon source, a nitrogen-containing gas such as $N_2$ or $NH_3$, and a plasma-initiating gas in a PECVD chamber. In another embodiment, the nitrogen-doped amorphous carbon layer may be deposited by flowing, among others, a hydrocarbon source, such as a gas-phase hydrocarbon or a liquid-phase hydrocarbon that has been entrained in a carrier gas, a nitrogen-containing hydrocarbon source, and a plasma-initiating gas into a PECVD chamber. The hydrocarbon source may be a mixture of one or more hydrocarbon compounds. In some embodiments, the hydrocarbon source may not be required. Instead, a nitrogen-containing hydrocarbon source and a plasma-initiating gas are flowed into the PECVD chamber to form the nitrogen-doped amorphous carbon protective layer on the patterned features 321 and the exposed surfaces of the substrate 300.

The hydrocarbon compounds may be partially or completely doped derivatives of hydrocarbon compounds, including fluorine-, oxygen-, hydroxyl group-, and boron-containing derivatives of hydrocarbon compounds. Hydrocarbon compounds or derivatives thereof that may be included in the hydrocarbon source may be described by the formula $C_xH_y$, where x has a range of between 1 and 10 and y has a range of between 2 and 30. Suitable hydrocarbon compounds may include, but are not limited to, acetylene ($C_2H_2$), ethane ($C_2H_6$), propylene ($C_3H_6$), propyne ($C_3H_4$), propane ($C_3H_8$), butane ($C_4H_{10}$), butylene ($C_4H_8$), butyne ($C_4H_6$), vinylacetylene, phenylacetylene ($C_8H_6$), benzene, styrene, toluene, xylene, ethylbenzene, acetophenone, methyl benzoate, phenyl acetate, phenol, cresol, furan, alpha-terpinene, cymene, 1,1,3,3-tetramethylbutylbenzene, t-butylether, t-butylethylene, methyl-methacrylate, and t-butylfurfurylether, compounds having the formula $C_3H_2$ and $C_5H_4$, monofluorobenzene, difluorobenzenes, tetrafluorobenzenes, hexafluorobenzene, and the like. Additional suitable hydrocarbons may include ethylene, pentene, butadiene, isoprene, pentadiene, hexadiene, monofluoroethylene, difluoroethylenes, trifluoroethylene, tetrafluoroethylene, monochloroethylene, dichloroethylenes, trichloroethylene, tetrachloroethylene, and the like.

Nitrogen containing hydrocarbon compounds or derivatives thereof that may be included in the nitrogen containing hydrocarbon source can be described by the formula $C_xH_yN_z$, where x has a range of between 1 and 12, y has a range of between 2 and 20, and z has a range of between 1 and 10. Suitable nitrogen containing hydrocarbon compounds may include one or more of the following compounds methylamine, dimethylamine, trimethylamine (TMA), triethylamine, aniline, quinoline, pyridine, acrylonitrile, and benzonitrile.

In certain embodiments, the nitrogen doped amorphous carbon deposition process may include the use of a plasma-initiating gas that is introduced into the PECVD chamber at before and/or same time as the hydrocarbon compound and a plasma is initiated to begin deposition. The plasma-initiating gas may be a high ionization potential gas including, and not limited to, helium gas, hydrogen gas, nitrogen gas, argon gas and combinations thereof. The plasma-initiating gas may also be a chemically inert gas, such as helium gas, nitrogen gas, or argon gas. Suitable ionization potentials for gases are from about 5 eV (electron potential) to 25 eV. The plasma-initiating gas may be introduced into the PECVD chamber prior to the nitrogen containing hydrocarbon source and/or the hydrocarbon source, which allows a stable plasma to be formed and reduces the chances of arcing. An inert gas used as a diluent gas or a carrier gas, such as argon, may be introduced with the plasma-initiating gas, the nitrogen containing hydrocarbon source, the hydrocarbon source, or combinations thereof. Suitable dilution gases such as helium (He), hydrogen ($H_2$), nitrogen ($N_2$), ammonia ($NH_3$), or combinations thereof, among others, may be added to the gas mixture, if desired. Ar, He, and $N_2$ are used to control the density and deposition rate of the amorphous carbon layer. In some cases, the addition of $H_2$ and/or $NH_3$ can be used to control the hydrogen ratio of the amorphous carbon layer. Alternatively, dilution gases may not be used during the deposition.

In cases where the nitrogen-doped amorphous carbon is deposited using a hydrocarbon source and a nitrogen-containing gas, the nitrogen-containing gas may be introduced into the PECVD chamber at a nitrogen-containing gas to hydrocarbon source ratio of about 1:100 to about 10:1.

In various embodiments, the nitrogen doped amorphous carbon layer may be deposited at a chamber pressure of about 0.5 Torr or greater, such as from about 0.5 Torr to about 20 Torr, and in one embodiment, about 2 Torr or greater, for example, from about 2 Torr to about 12 Torr, and a substrate temperature from about 25° C. to about 800° C., such as at a temperature from about 200° C. to about 400° C. The electrode spacing between a showerhead and substrate surface when depositing the layer may be between 200 mils and 5,000 mils spacing, for example, about 500 mils spacing. In certain embodiments, where a plasma is used, the hydrocarbon source, the nitrogen doped amorphous carbon source, and the plasma-initiating gas are introduced into the PECVD chamber and a plasma is initiated to begin the deposition.

Plasma may be generated by applying RF power at a power density to substrate surface area of from about 0.01 W/cm$^2$ to about 5 W/cm$^2$, such as from about 0.8 W/cm$^2$ to about 2.3 W/cm$^2$, for example, about 2 W/cm$^2$. The power application may be from about 1 Watt to about 2,000 watts, such as from about 10 W to about 100 W, for a 300 mm substrate. It is noted that the RF power can be either single frequency or dual frequency. If a single frequency power is used, the frequency power may be between about 10 KHz and about 30 MHz. If a dual-frequency RF power is used to generate the plasma, a mixed RF power may be used. The mixed RF power may provide a high frequency power in a range from about 10 MHz to about 30 MHz, for example, about 13.56 MHz, as well as a low frequency power in a range of from about 10 KHz to about 1 MHz, for example, about 350 KHz. A dual frequency RF power application is believed to provide independent control of flux and ion energy since the energy of the ions hitting the film surface influences the film density. The applied RF power and use of one or more frequencies may be varied based upon the substrate size and the equipment used. In certain embodiments, a single frequency RF power application may be used, and is typically, an application of the high frequency power as described herein.

An exemplary deposition process for processing 300 mm circular substrates may employ, among others, a plasma-initiating gas, a nitrogen containing hydrocarbon source, and a dilution gas. The deposition process may include supplying a plasma-initiating gas, such as helium and/or argon, at a flow rate from about 0 sccm to about 50,000 sccm, for example, between about 400 sccm to about 8,000 sccm, supplying a nitrogen containing hydrocarbon source, at a flow rate from about 10 sccm to about 2,000 sccm, for example, from about 500 sccm to about 1,500 sccm. In case the nitrogen containing hydrocarbon source is a liquid precursor, then the nitrogen containing hydrocarbon source flow can be between 15 mg/min and 2,000 mg/min, for example between 100 mg/min and 1,000 mg/min. A dilution gas, such as NH$_3$, He, Ar, H$_2$, or N$_2$, may be supplied at a flow rate from about 0 sccm to about 5,000 sccm, for example about 500 sccm to about 1,000 sccm. The deposition process may be performed with a dual frequency RF power from about 5 W to about 1,600 W, for example between about 10 W and about 100 W, at a chamber pressure from about 0.5 Torr to about 50 Torr, for example between about 5 torr and about 15 Torr, and a substrate temperature from about 25° C. to about 650° C., for example between about 200° C. and about 400° C. This process range provides a deposition rate for a nitrogen doped amorphous carbon layer in the range of about 10 Å/min to about 30,000 Å/min. One skilled in the art, upon reading the disclosure herein, can calculate appropriate process parameters in order to produce a nitrogen doped amorphous carbon film of different deposition rates. The as-deposited nitrogen-doped amorphous carbon layer has an adjustable carbon:nitrogen ratio that ranges from about 0.1% nitrogen to about 4.0% nitrogen, such as about 1.5% to about 2%. An example of nitrogen doped amorphous carbon materials deposited by the processes described herein is provided as follows.

A nitrogen doped amorphous carbon deposition process may include providing a flow rate of helium to the processing chamber at about 200 sccm to 1,500 sccm, for example about 500 sccm, providing a flow rate of benzonitrile to the processing chamber at about 100 mg/min to about 1,000 mg/min, and providing a flow rate of ammonia to the processing chamber at about 0 sccm to about 2,000 sccm, applying a high frequency RF power (13.56 MHz) at about 30 W to 200 W (for a 200 mm wafer), maintaining a deposition temperature of about 200° C. to about 550° C., maintaining a chamber pressure of about 2 Torr to 15 Torr, with a spacing of about 100 mils to about 800 mils to produce a nitrogen doped amorphous carbon layer having a thickness of about 10 Å to about 1,000 Å.

Referring back to FIG. 2, at box 210, after the carbon-based protective layer 340 has been deposited conformally on the patterned features 321, the carbon-based protective layer 340 is anisotropically etched (a vertical etch) to expose an upper surface of the substrate 300 in areas 311 and expose an upper surface of patterned features 321, resulting in patterned features 321 (formed from the sacrificial structural layer 320) protected by carbon-based sidewall spacers 341, as shown in FIG. 3D.

At box 212, the patterned features 321 (formed from the sacrificial structural layer 320) are removed using a conventional plasma etching process or other suitable wet stripping process, leaving non-sacrificial carbon-based sidewall spacers 341 as shown in FIG. 3E. The plasma etching process may be done by introducing a fluorine-based etching chemistry into a plasma above the substrate. Due to the improved material quality and coverage, the carbon-based sidewall spacers 341 are not damaged because they have very good selectivity to the fluorine-based reactive etching chemistry or the wet strip-based chemistry. Upon removal of the patterned features 321, the remaining carbon-based sidewall spacers 341 may be used as a hardmask for etching the underlying layer, layer stack, or structure. Particularly, the density of the carbon-based sidewall spacers 341 in accordance with this patterning process is twice that of the photo-lithographically patterned features 321, the pitch of carbon-based sidewall spacer 341 is half the pitch of the patterned features 321.

Figure 4:
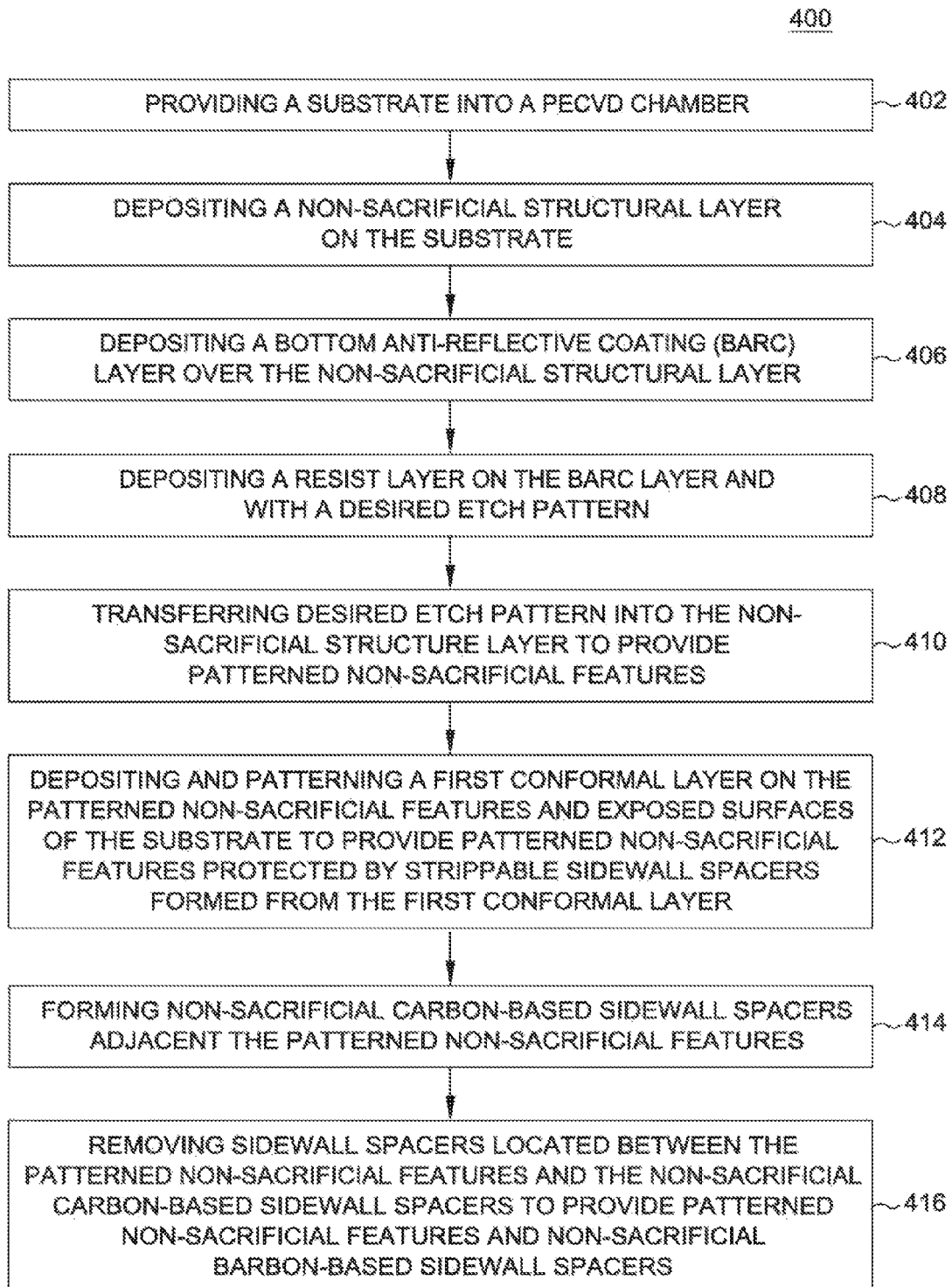
FIG. 4 is a flowchart depicting steps associated with an exemplary patterning process according to another embodiment of the invention.

FIG. 4 is a flowchart depicting steps associated with an exemplary patterning process according to another embodiment of the invention. FIGS. 5A-5H illustrate cross-sectional views of a structure formed by the steps set forth in FIG. 4. It is noted that the concept of this embodiment is equally applicable to other processes, single or dual patterning scheme, such as via/hole shrink process, back end of line (BEOL) self-aligned double patterning (SADP) process, or self-aligned quadruple patterning (SAQP) process, etc. that may require the use of protective spacers with variable line width and spacing or protective sacrificial layer as needed in various semiconductor processes such as NAND flash application, DRAM application, or CMOS application, etc.

The process 400 starts at box 402 by providing a substrate 500 into a processing chamber, such as a PECVD chamber. The substrate 500 may be one or more materials used in forming semiconductor devices including a silicon material, an oxide material, a polysilicon material, or the like, as discussed above with respect to substrate 300 shown in FIG. 3A.

At box 404, a sacrificial structural layer 520 is deposited on the substrate 500 as shown in FIG. 5B. The sacrificial structural layer 520 may be a carbon-based material such as amorphous carbons. In one example, the sacrificial structural layer 520 is an Advanced Patterning Film™ (APF) material commercially available from Applied Materials, Inc. of Santa Clara, Calif. While not shown, in certain embodiments where a carbon-based sacrificial structural layer is used, one or more anti-reflective coating layers may be deposited on the carbon-based sacrificial structural layer to control the reflection of light during a lithographic patterning process. Suitable anti-reflective coating layer may include silicon dioxide, silicon oxynitride, silicon nitride, or combinations thereof. One exemplary anti-reflective coating layer may be a DARC™ material commercially available from Applied Materials, Inc. of Santa Clara, Calif.

At box 406, a bottom anti-reflective coating (BARC) layer 540 is deposited over the sacrificial structure layer 520. The BARC layer 540 may be an organic material such as polyamides and polysulfones. The BARC layer 540 is believed to reduce reflection of light during patterning of the subsequent resist layer and is also helpful for thinner resist layers because the BARC layer 540 increases the total thickness of the multi-layered mask for improved etch resistance during etch of underlying layer or structure. In certain embodiments, the BARC layer 540 may further include a light absorbing layer 530 deposited between the BARC layer 540 and the sacrificial structure layer 520 as shown in FIG. 5C, to improve photolithography performance. The light absorbing layer 530 may be a metal layer, such as nitrides. In one example, the light absorbing layer 530 is titanium nitride.

At box 408, a resist layer, such as a photoresist material, is then deposited on the BARC layer 540. The resist layer is then patterned by a lithographic process producing a patterned resist layer 550 with a desired etch pattern 551, as shown in FIG. 5D. The etch pattern 551 is shown to have different pattern width for exemplary purpose.

At box 410, the BARC layer 540, the light absorbing layer 530, and the sacrificial structure layer 520 are patterned respectively using conventional photolithography and etching processes to transfer the desired etch pattern 551 into the sacrificial structure layer 520, leaving patterned sacrificial features 521 as shown in FIG. 5E.

At box 412, a first sidewall spacer layer 561 is deposited conformally or substantially conformally on the patterned sacrificial features 521 and the exposed surfaces of the substrate 500. The first sidewall spacer layer 561 may comprise a strippable material having a etching rate faster than an etching rate of the patterned sacrificial features 521. Suitable materials for the first sidewall spacer layer 561 may include, for example, oxides such as silicon dioxide, silicon oxynitride, or nitride such as silicon nitride.

At box 414, non-sacrificial carbon-based sidewall spacers 571 are then conformally formed on the first sidewall spacer layer 561 in a manner similar to the sidewall spacers 561. The non-sacrificial carbon-based sidewall spacers 571 may be an amorphous carbon (a-C) undoped or doped with nitrogen formed by the processes as described above with respect to boxes 208 and 210. In one embodiment, the non-sacrificial carbon-based sidewall spacers 571 are nitrogen-doped amorphous carbon.

At box 416, the non-sacrificial carbon-based sidewall spacers 571 are selectively removed using an anisotropic etching process or other suitable process to expose the first sidewall spacer layer 561 on the remaining upper surfaces of the patterned sacrificial features 521 and to expose the first sidewall spacer layer 561 on the portions of the upper surface of the substrate 500. The first sidewall spacer layer 561 is then selectively removed using an anisotropic etching process to expose the upper surface of the patterned sacrificial features 521 and to expose the upper surface of the substrate not covered by the non-sacrificial carbon-based sidewall spacers 571, leaving side walls of the patterned sacrificial features 521 protected by the first sidewall spacer layer 561 and the non-sacrificial carbon-based sidewall spacers 571, as shown in FIG. 5F. The remaining non-sacrificial carbon-based sidewall spacers 571 are then removed, as shown in FIG. 5G. Thereafter, the remaining patterned sacrificial features 521 and exposed portions of the underlying substrate, such as a layer, layer stack or structure, are removed using the remaining sidewall spacers 561 as a hardmask. Particularly, the density of the resulting hardmask (i.e., remaining sidewall spacers 561) in accordance with this patterning process is triple that of the patterned resist layer 550, and the pitch of resulting hardmask is half the pitch of the patterned resist layer 550.

Carbon-based protective layers or sidewall spacers deposited in accordance with the present invention have been observed to be able to provide excellent conformality higher than 95% with an improved film uniformity of about 1.5%, high film density of about 1.25-1.60 g/cc, and a compressive film stress less than 50 MPa. Since the sidewalls of hard mask spacers are not damaged during the ashing or anisotropic plasma etching process, the line edge roughness is significantly reduced as compared to the conventional ALD grown spacers using silicon oxide materials. Therefore, the resulting hard mask spacers can provide superior etch profile and etch selectivity with little or no microloading.

While the foregoing is directed to embodiments of the present invention, other and further embodiments of the invention may be devised without departing from the basic scope thereof, and the scope thereof is determined by the claims that follow.

The invention claimed is:
1. A method of processing a substrate in a processing chamber, comprising:
   depositing a dielectric layer on a substrate;
   depositing a sacrificial structural layer on an upper surface of the dielectric layer;
   transferring a pattern into the sacrificial structural layer by removing portions of the sacrificial structural layer to expose portions of the upper surface of the dielectric layer;
   forming a spacer layer conformally on the portions of the upper surface of the dielectric layer and on remaining portions of the sacrificial structural layer;
   after the forming a spacer layer conformally on the portions of the upper surface of the dielectric layer and on remaining portions of the sacrificial structural layer, forming a protection layer conformally on the spacer layer without removing the spacer layer, wherein the protection layer is an amorphous carbon material;
   after the forming a protection layer conformally on the spacer layer, selectively removing a portion of the protection layer using an anisotropic etching process to expose the spacer layer on remaining upper surfaces of the sacrificial structural layer and to expose the spacer layer on the portions of the upper surface of the dielectric layer;
   after the selectively removing a portion of the protection layer, selectively removing the spacer layer using an anisotropic etching process to expose the upper surface of the patterned sacrificial structural layer and to expose the upper surface of the dielectric layer, wherein the forming a protection layer conformally on the spacer layer is performed before the selectively removing the spacer layer; then completely removing remaining portions of the protection layer without removing the patterned sacrificial structural layer and the spacer layer; and then removing the patterned sacrificial structural layer and removing exposed portions of the dielectric layer using the spacer layer as a hardmask.

2. The method of claim 1, wherein the sacrificial structural layer comprises silicon oxide, silicon nitride, polysilicon, or amorphous carbon.

3. The method of claim 1, wherein the protection layer is formed by a gas mixture comprising a hydrocarbon source.

4. The method of claim 3, wherein the hydrocarbon source comprises one or more hydrocarbon compounds selected from the group consisting of acetylene ($C_2H_2$), ethylene ($C_2H_4$), ethane ($C_2H_6$), propylene ($C_3H_6$), propyne ($C_3H_4$), propane ($C_3H_8$), butane ($C_4H_{10}$), butylene ($C_4H_8$), butadiene ($C_4H_6$), phenylacetylene ($C_8H_6$), and combinations thereof.

5. The method of claim 1, wherein the protection layer is a nitrogen-doped amorphous carbon material.

6. The method of claim 5, wherein the nitrogen-doped amorphous carbon material has between about 0.1% of nitrogen to about 4.0% of nitrogen.

7. The method of claim 5, wherein the nitrogen-doped amorphous carbon material has a compressive film stress less than 50 MPa.

8. The method of claim 5, wherein the nitrogen-doped amorphous carbon material is formed by a gas mixture comprising a nitrogen-containing hydrocarbon source.

9. The method of claim 8, wherein the nitrogen-containing hydrocarbon source comprises one or more nitrogen containing hydrocarbon compounds selected from the group consisting of methylamine, dimethylamine, trimethylamine (TMA), triethylamine, aniline, quinoline, pyridine, acrylonitrile, benzonitrile, and combinations thereof.

10. The method of claim 9, wherein the nitrogen-containing hydrocarbon compound is benzonitrile.

11. The method of claim 8, wherein the protection layer is formed by flowing into the processing chamber the nitrogen-containing hydrocarbon source at a flow rate of about 100 mg/min to about 1000 mg/min, a dilution gas at a flow rate of about 500 sccm to about 1000 sccm, and applying RF power of about 10 W to about 100 W (for a 300 mm circular substrate) at a deposition temperature of about 200° C. to about 400° C. and a chamber pressure of about 5 Torr to about 15 Torr.

12. The method of claim 5, wherein the nitrogen-doped amorphous carbon material is formed by a gas mixture comprising a hydrocarbon source and a nitrogen-containing gas.

13. The method of claim 12, wherein the hydrocarbon source comprises one or more hydrocarbon compounds selected from the group consisting of acetylene ($C_2H_2$), ethylene ($C_2H_4$), ethane ($C_2H_6$), propylene ($C_3H_6$), propyne ($C_3H_4$), propane ($C_3H_8$), butane ($C_4H_{10}$), butylene ($C_4H_8$), butadiene ($C_4H_6$), phenylacetylene ($C_8H_6$), and combinations thereof.

14. The method of claim 12, wherein the hydrocarbon source and the nitrogen-containing gas are flowed into the processing chamber at a nitrogen-containing gas to hydrocarbon source ratio of about 1:100 to about 10:1.

15. The method of claim 1, wherein the protection layer has a thickness of between about 5 Å and about 200 Å.

16. The method of claim 1, wherein the substrate comprises a plurality of alternating oxide and nitride materials, one or more oxide materials or nitride materials, polysilicon or amorphous silicon materials, oxides alternating with amorphous silicon, oxides alternating with polysilicon, undoped silicon alternating with doped silicon, undoped polysilicon alternating with doped polysilicon, or updoped amorphous silicon alternating with doped amorphous silicon.

17. A method of processing a substrate in a processing chamber, comprising:

depositing a dielectric layer on a substrate;

depositing a sacrificial structural layer on an upper surface of the dielectric layer;

transferring a pattern into the sacrificial structural layer by removing portions of the sacrificial structural layer to expose portions of the upper surface of the dielectric layer;

forming a spacer layer conformally on the portions of the upper surface of the dielectric layer and on remaining portions of the sacrificial structural layer;

after the forming a spacer layer conformally on the portions of the upper surface of the dielectric layer and on remaining portions of the sacrificial structural layer, forming a protection layer conformally on the spacer layer without removing the spacer layer, wherein the protection layer is a nitrogen-doped amorphous carbon material having a compressive film stress less than 50 MPa, and the nitrogen-doped amorphous carbon material is formed by a gas mixture comprising benzonitrile;

after the forming a protection layer conformally on the spacer layer, selectively removing a portion of the protection layer using an anisotropic etching process to expose the spacer layer on remaining upper surfaces of the sacrificial structural layer and to expose the spacer layer on the portions of the upper surface of the dielectric layer;

after the selectively removing a portion of the protection layer, selectively removing the spacer layer using an anisotropic etching process to expose the upper surface of the patterned sacrificial structural layer and to expose the upper surface of the dielectric layer, wherein the forming a protection layer conformally on the spacer layer is performed before the selectively removing the spacer layer; then completely removing remaining portions of the protection layer without removing the patterned sacrificial structural layer and the spacer layer; and then removing the patterned sacrificial structural layer and removing exposed portions of the dielectric layer using the spacer layer as a hardmask.

* * * * *

UNITED STATES PATENT AND TRADEMARK OFFICE
CERTIFICATE OF CORRECTION

PATENT NO.        : 9,570,303 B2                                    Page 1 of 1
APPLICATION NO.   : 14/736848
DATED             : February 14, 2017
INVENTOR(S)       : Sungjin Kim et al.

It is certified that error appears in the above-identified patent and that said Letters Patent is hereby corrected as shown below:

In the Drawings

On sheet 5 of 6, in Figure 4, reference numeral 416, Line 5, delete "BARBON-" and insert -- CARBON- --, therefor.

In the Specification

In Column 1, Line 10, delete "Jan. 16, 2013," and Insert -- Jul. 11, 2014, --, therefor.

In Column 5, Line 1, delete "updoped" and insert -- undoped --, therefor.

In the Claims

In Column 12, Line 12, in Claim 16, delete "updoped" and insert -- undoped --, therefor.

Signed and Sealed this
Eleventh Day of April, 2017

Michelle K. Lee
*Director of the United States Patent and Trademark Office*